United States Patent
Gao et al.

(10) Patent No.: US 10,289,795 B1
(45) Date of Patent: May 14, 2019

(54) ROUTING TREE TOPOLOGY GENERATION

(71) Applicant: Cadence Design Systems, Inc., San Jose, CA (US)

(72) Inventors: Jhih-Rong Gao, Austin, TX (US); Thomas Andrew Newton, Great Cambourne (GB); Derong Liu, Austin, TX (US); Mehmet Can Yildiz, Austin, TX (US); Charles Jay Alpert, Cedar Park, TX (US); Zhuo Li, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 4 days.

(21) Appl. No.: 15/683,659

(22) Filed: Aug. 22, 2017

(51) Int. Cl.
*G06F 17/50* (2006.01)

(52) U.S. Cl.
CPC .................. *G06F 17/5077* (2013.01)

(58) Field of Classification Search
CPC ............. G06F 17/5077; G06F 17/5045; G06F 2217/84
USPC .......................................... 716/55, 126, 130
See application file for complete search history.

(56) References Cited

U.S. PATENT DOCUMENTS

| | | | |
|---|---|---|---|
| 5,072,402 A * | 12/1991 | Ashtaputre et al. | G06F 17/5077 716/130 |
| 5,434,972 A * | 7/1995 | Hamlin | G06F 9/4494 709/238 |
| 6,671,283 B1 * | 12/2003 | Mitts et al. | H04L 49/256 370/256 |
| 6,766,502 B1 * | 7/2004 | Pyo et al. | G06F 17/5077 716/129 |
| 2003/0026246 A1 * | 2/2003 | Huang et al. | H04L 45/00 370/352 |
| 2016/0118966 A1 * | 4/2016 | Chowdhury et al. | H03K 5/05 327/161 |

OTHER PUBLICATIONS

Vaisband et al.,"Low Power Clock Network Design", May 2011, Journal of Low Power Electronics and Applications, pp. 219-246.*

* cited by examiner

*Primary Examiner* — Sun J Lin
(74) *Attorney, Agent, or Firm* — Schwegman Lundberg & Woessner, P.A.

(57) ABSTRACT

Systems, methods, media, and other such embodiments described herein relate to generation of routing trees. One embodiment involves accessing a circuit design comprising a source, a plurality of sinks, and a skew threshold associated with the source and the plurality of sinks. An initial routing tree is generated between the source and the plurality of sinks, and then a first intermediate point is identified between the source and the plurality of sinks. The first intermediate point may be identified based on a median location of all sinks of the plurality of sinks, or other criteria. The first intermediate point is then used for an updated routing tree. In some embodiments, a process proceeds iteratively until the skew threshold is reached or a maximum wire length is exceeded.

20 Claims, 14 Drawing Sheets

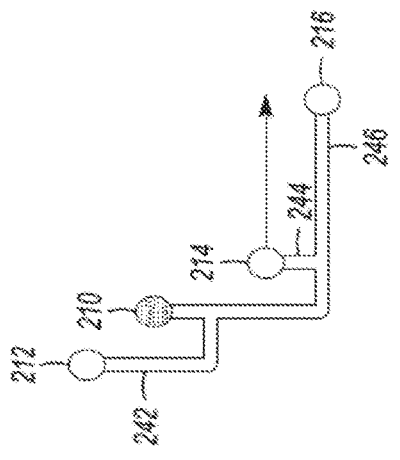
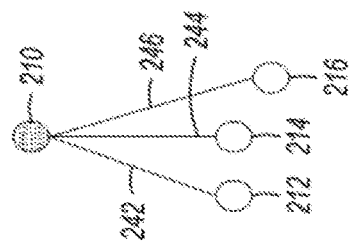
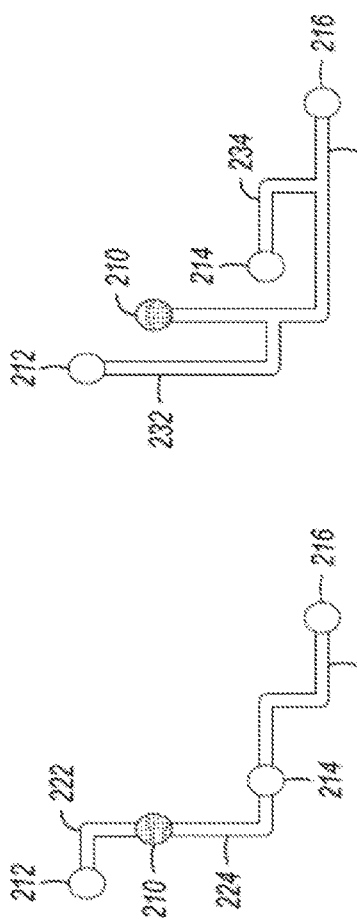
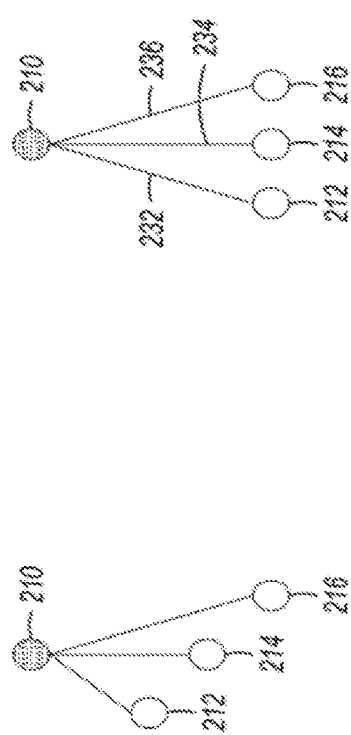
FIG. 2A  FIG. 2C  FIG. 2E
FIG. 2B  FIG. 2D  FIG. 2F

ROUTING TREE TOPOLOGY GENERATION

TECHNICAL FIELD

Embodiments described herein relate to electronic design automation (EDA), and to systems, methods, devices, and instructions for generating circuit designs including routing trees based on timing considerations, skew limits, and wire length limits.

BACKGROUND

Electronic design automation (EDA) is a category of systems for assisting with the design of electronic systems and devices. Large, integrated circuit designs are often assembled from previously designed blocks. This enables reduced turnaround times for generation of an integrated circuit. Automated design of routing connections between individual circuit elements or design blocks are also part of such EDA system operations. Schematic and layout information for such block portions of a design may be exchanged or licensed as intellectual property. Timing analysis is an EDA verification analysis whereby the timing of circuit elements and/or circuit blocks is analyzed to verify that the design meets constraints in order to operate at intended clock rates in an expected operating environment.

BRIEF DESCRIPTION OF THE DRAWINGS

Various ones of the appended drawings merely illustrate example embodiments of the present disclosure and should not be considered as limiting its scope.

FIG. 2A illustrates aspects of routing tree generation in accordance with some embodiments described herein.

FIG. 2B illustrates aspects of routing tree generation in accordance with some embodiments described herein. 7

FIG. 2C illustrates aspects of routing tree generation in accordance with some embodiments described herein.

FIG. 2D illustrates aspects of routing tree generation in accordance with some embodiments described herein.

FIG. 2E illustrates aspects of routing tree generation in accordance with some embodiments described herein.

FIG. 2F illustrates aspects of routing tree generation in accordance with some embodiments described herein.

DETAILED DESCRIPTION

Embodiments described herein relate to electronic design automation (EDA) and to methods, computer media, and devices used for analyzing, optimizing, and creating electronic circuits. One of the many complex elements of circuit design is the generation of routing trees that convey a signal from a signal origin, or source, to a signal destination, or sink. A clock tree, for example, has a single source, with hundreds or thousands of destination sinks. Additionally, the design may have limits on the amount of time a signal can take to get to the furthest sink (e.g., a maximum arrival time) as well as limits on the differences between arrival times at various sinks and limits on the total wavelength in a tree.

Some embodiments herein describe an approach to generating a routing tree using routing to intermediate points to decrease skew while limiting the extra wire used in a routing tree. After starting with an initial routing tree, an updated routing tree may be generated with intermediate points determined by a median or mean position of all sinks to be connected to a routing tree in some embodiments. In some embodiments, multiple tiers of intermediate points may be used, with the placement of intermediate points for each tier based on various criteria to avoid blocking circuit elements and decrease skew below a skew threshold. Additional details of various embodiments for using intermediate routing points for routing tree generation are described below.

Figure 1:
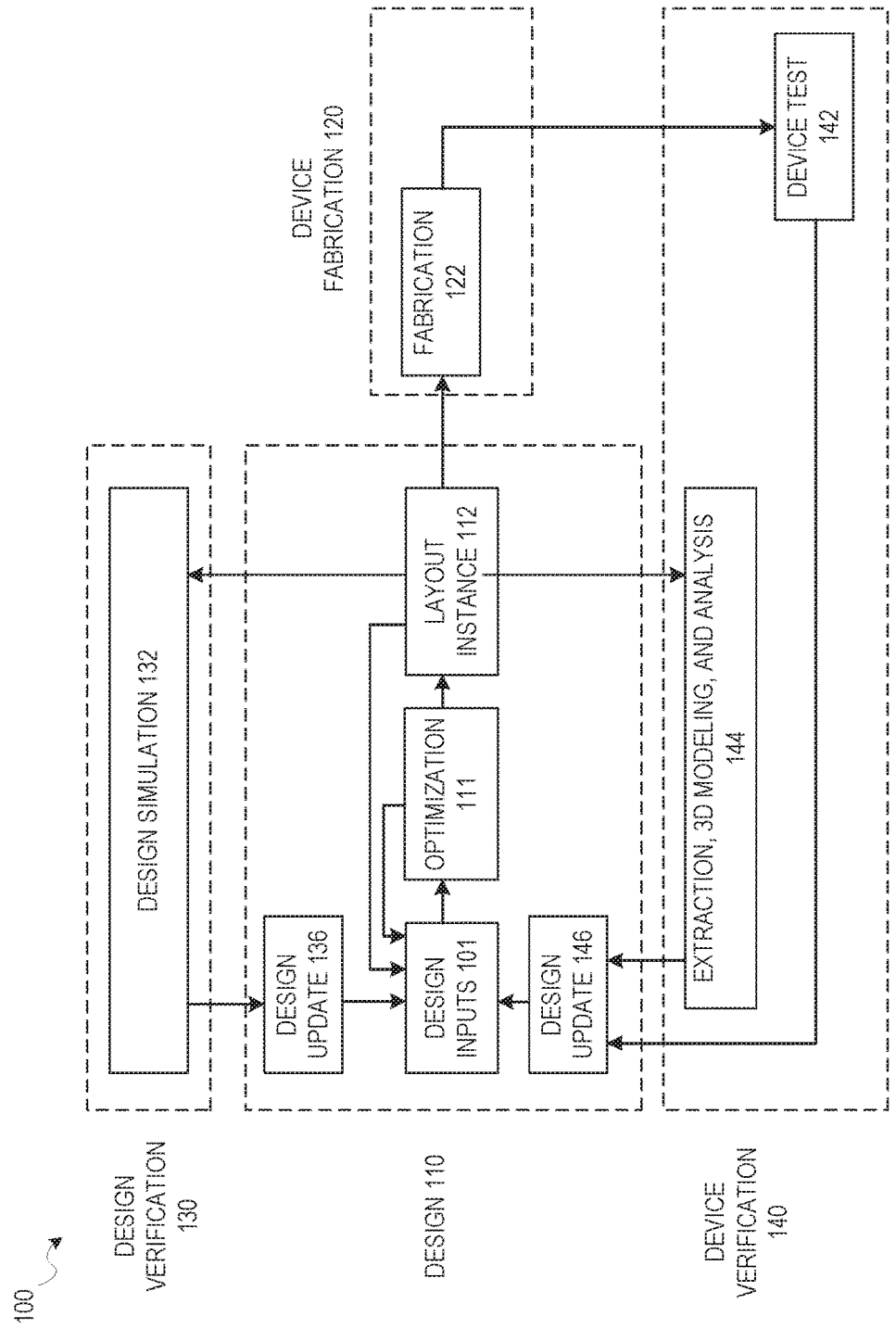
FIG. 1 is a diagram illustrating one possible design process flow which includes elements for routing tree generation in accordance with some embodiments.

FIG. 1 is a diagram illustrating one possible design process flow which includes elements for routing tree generation in accordance with some embodiments. This includes possible design process flows for timing and signal integrity analysis to generate a circuit design and an associated circuit in accordance with various example embodiments, and operations for modifying such circuits automatically to generate routing tree structures that comply with limits on skew, wire length, maximum arrival time, and other such timing considerations. It will be apparent that other design flow operations may function using the timing constraints and optimizations described herein, but design flow 100 is described here for the purposes of illustration. As illustrated, the overall design flow 100 includes a design phase 110, a device fabrication phase 120, a design verification phase 130, and a device verification phase 140. The design phase 110 involves an initial design input operation 101 where the basic elements and functionality of a device are determined, as well as revisions based on various analyses and optimization of a circuit design. This design input operation 101 is where initial layouts for a balanced clock tree structure and sinks are generated, before adjustments are made to ensure that timing requirements for each sink are met. The initial strategy, tactics, and context for the device to be created are also generated in the design input operation 101, depending on the particular design algorithm to be used.

In some embodiments, following an initial selection of design values in design input operation 101, updates to an initial routing tree may be generated in accordance with various embodiments described herein during optimization operation 111 or layout instance 112, along with any other automated design processes. As described below, design constraints for a routing tree structure and sinks which receive a signal from the routing tree structure may be initiated with design inputs in design input operation 101, and then may be analyzed using timing analysis according to various embodiments. In accordance with embodiments described herein, such inputs may include a maximum wire length for a routing tree, a maximum arrival time for the sinks connected to the routing time, and a maximum allowable skew for sinks to be connected to the routing tree. While design flow 100 shows such optimization occurring prior to layout instance 112, updates to a routing tree may be performed at any time to improve expected operation of a circuit design. For example, in various embodiments, constraints for blocks in a circuit design may be generated prior to routing of connections in a circuit design, after routing, during register transfer level (RTL) operations, or as part of a final signoff optimization or verification prior to a device fabrication operation 122. Certain embodiments of operations described herein for generating and updating a routing tree structure may therefore involve iterations of design input operation 101, optimization operation 111, and layout instance 112 generation. In other systems, other design processes may be used.

After design inputs are used in design input operation 101 to generate a circuit layout, and any optimization operations 111 are performed, a layout is generated in layout instance 112. The layout describes the physical layout dimensions of the device that match the design inputs. This layout may then be used in a device fabrication operation 122 to generate a device, or additional testing and design updates may be performed using designer inputs or automated updates based on the design simulation 132 operations or extraction, 3D modeling, and analysis 144 operations. Once the device is generated, the device can be tested as part of device test 142 operations, and layout modifications generated based on actual device performance.

As described in more detail below, design updates 136 from design simulation 132; design updates 146 from device test 142 or extraction, 3D modeling, and analysis 144 operations; or direct design input operation 101 may occur after an initial layout instance 112 is generated. In various embodiments, whenever design inputs are used to update or change an aspect of a circuit design, a timing analysis and optimization operation 111 may be performed.

FIGS. 2A-F illustrate aspects of routing tree generation in accordance with some embodiments described herein. As described above, skew is the difference between an earliest arrival time and a latest arrival time in a routing tree. In some embodiments, this is based simply on wire length from the source to each sink. In other embodiments, other factors may affect the arrival time for each sink. For simplicity, the descriptions herein are presented with respect to simple wire length, but it will be apparent that adjustment of the routing tree to change an arrival time with other factors may also be used in various other embodiments.

FIG. 2A shows a simple default routing tree with a minimum wire length and no consideration for skew. The circuit design of FIG. 2A includes source 210, sinks 212, 214, and 216, and routing paths 222, 224, and 226. Routing path 222 goes from source 210 to sink 212. Routing path 224 goes from source 210 to sink 214, and routing path 226 goes from source 210 to sink 216 (via sink 214). The path is the minimum path available for routing done on a grid. FIG. 2B shows a chart of the arrival times for the sinks in the circuit design of FIG. 2A, and illustrates that routing path 222 to sink 212 is significantly shorter than routing path 226 to sink 216, resulting in a large skew.

FIG. 2C illustrates a fully balanced routing tree with the same source 210 and sinks 212, 214, and 216. FIGS. 2A-E and the various embodiments shown in the figures herein are presented for illustrative purposes, and discussed in in view of example values (e.g. wirelength values). The particular values discussed below are used to illustrate the concepts associated with the example embodiments, and the figures presented are not necessarily exactly to scale. Rather than routing to minimize wire length, the routing tree of FIG. 2C adds wire length to minimize skew. As can be seen, routing path 236 from source 210 to sink 216 is the same length as routing path 226. The routing paths of FIG. 2C have been adjusted to lengthen the paths from the source 210 to sinks 212 and 214, so that these routing paths 232 and 234 are the same length as routing path 236. The skew illustration of FIG. 2D shows this routing with sinks 212, 214, and 216 associated with the same skew values for the routing tree of FIG. 2C. The wire length of the routing tree of FIG. 2C, however, is roughly one and a half times the wire length of the routing tree for FIG. 2A.

FIG. 2E then shows a circuit design with a routing tree balanced between skew and wire length. Normalizing the wire length of the design of FIG. 2A to 10 units of total wire length, the design of FIG. 2E adds roughly 2 units to the minimum path between source 210 and sink 212, resulting in routing path 242 instead of path 222. Similarly, the design of FIG. 2E adjusts the illustrated wirelength, such that a change from the design of FIG. 2A adds three units of wire length to the route between source 210 and sink 216, resulting in routing path 246. The overall wire length for each design is 10 units for the design of FIG. 2A, 15 units for the design of FIG. 2C, and 12 units for the design of FIG. 2E. In various circuit designs, the tradeoff between wire length and skew may result in different routing trees being used. Some embodiments described herein begin with an initial routing tree, with a minimum or short wire length, and then increase the wire length using intermediate steps to decrease skew. In some embodiments, this process is performed iteratively, until either a skew threshold is met, or a maximum allowable wire length is passed.

Figure 3A:
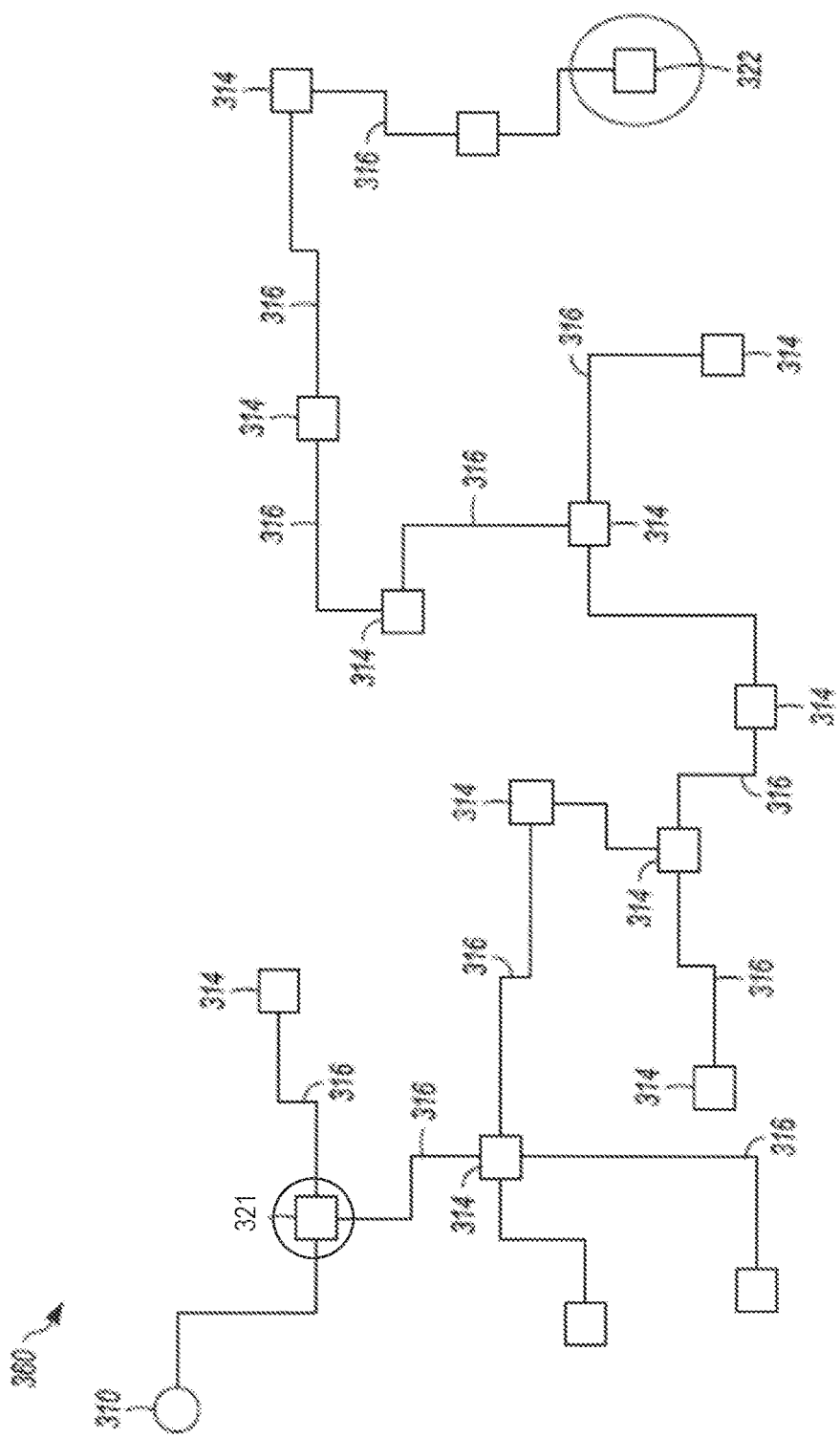
FIG. 3A illustrates aspects of routing tree generation in accordance with some embodiments described herein.
Figure 3B:
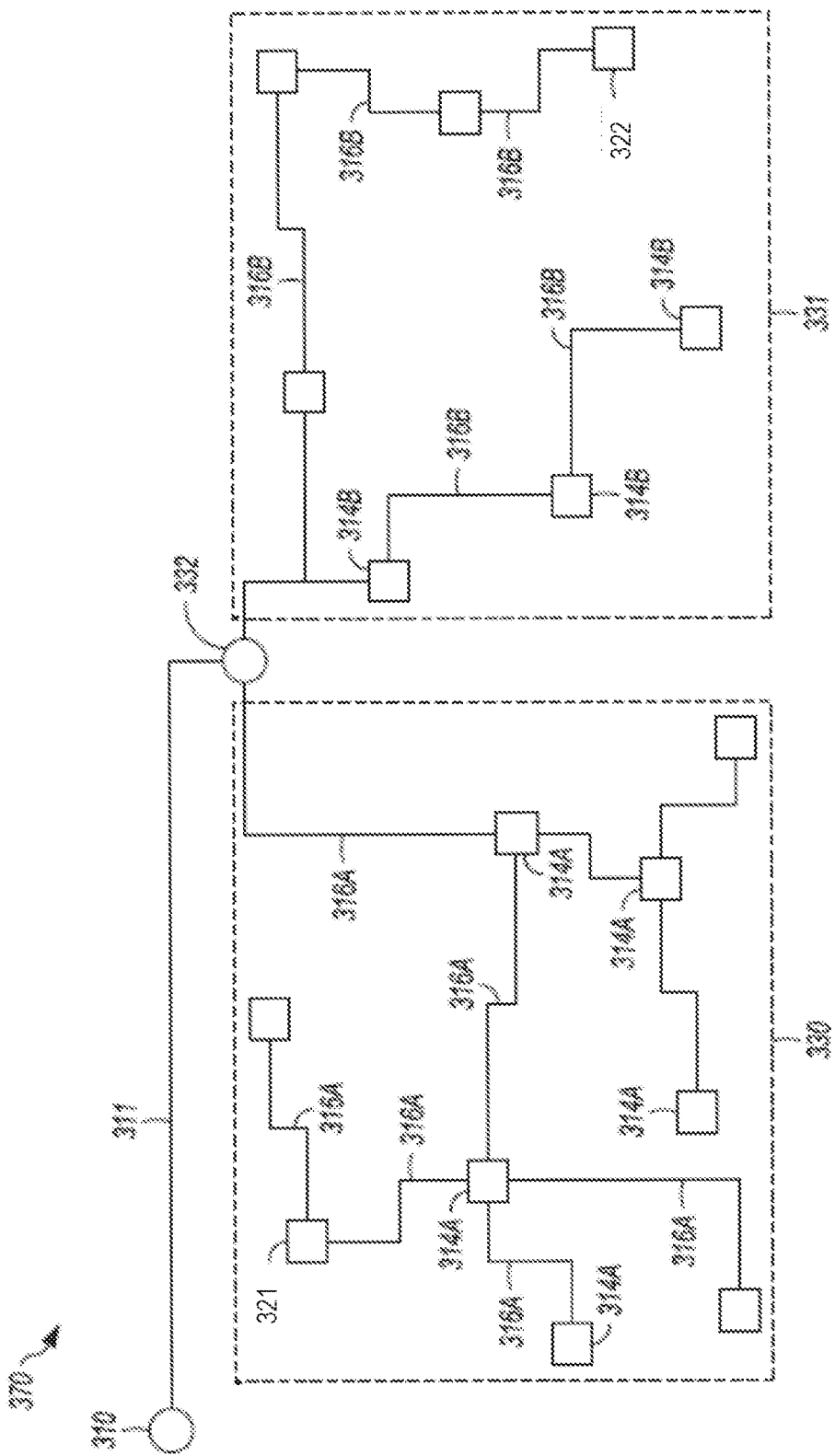
FIG. 3B illustrates aspects of routing tree generation in accordance with some embodiments described herein.
Figure 3C:
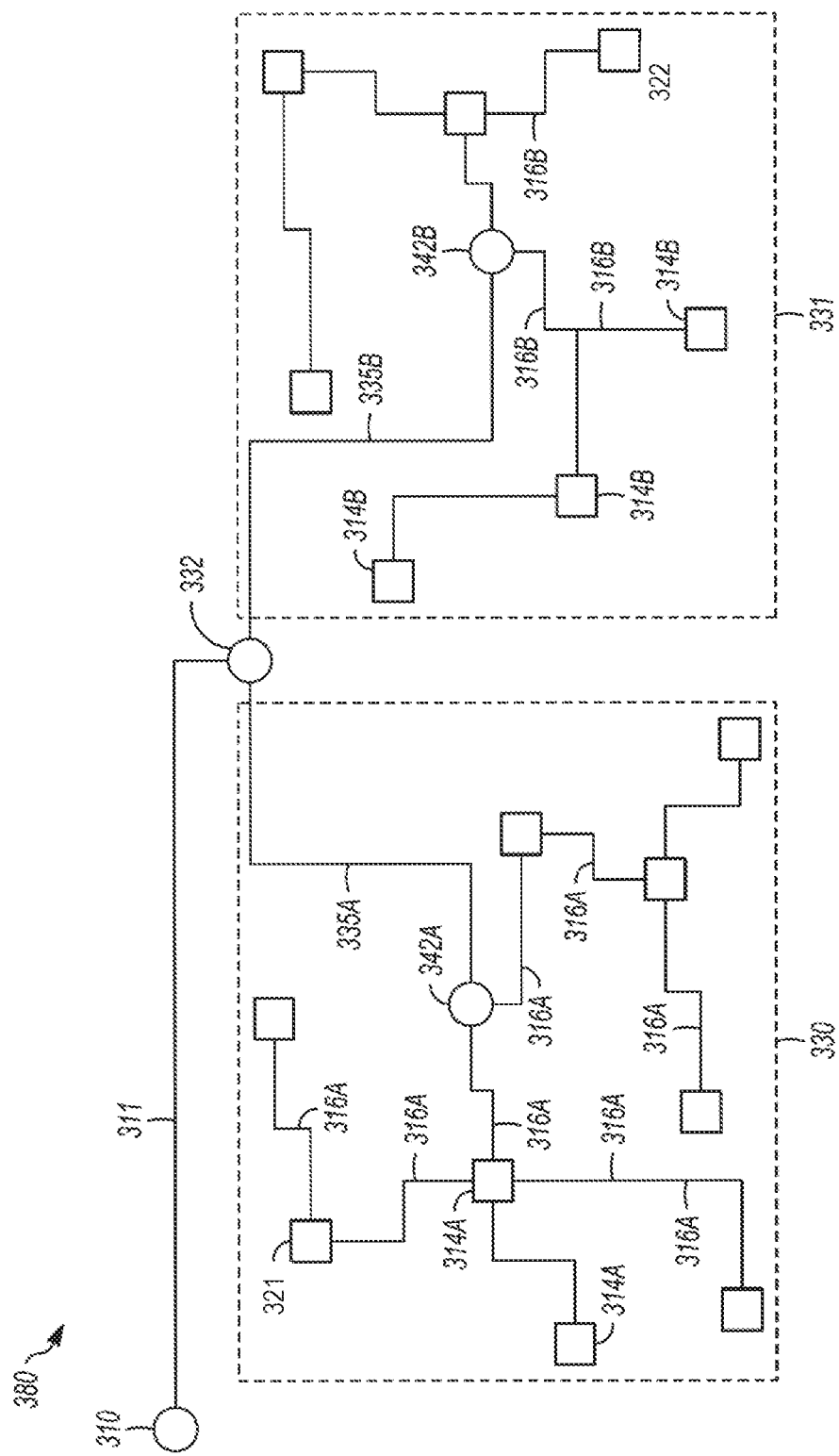
FIG. 3C illustrates aspects of routing tree generation in accordance with some embodiments described herein.

FIGS. 3A-C illustrate aspects of routing tree generation in accordance with some embodiments described herein. FIGS. 3A-C show progressively updated routing trees for a given source 310 connected to a plurality of sinks 314 via routing paths 316. FIG. 3A shows an initial routing tree 360. In some embodiments, the initial routing tree 360 is generated to minimize wire length (e.g., a Steiner tree for a given routing grid). In other embodiments, other criteria are used for the initial routing tree 360. For example, as discussed further below, any tree, including the initial tree, may be adjusted based on blocking objects or the placement of other circuit elements that preclude placement of a wire in a given space. As can be seen in FIG. 3A, the routing path length difference between a closest sink 321 and a furthest sink 322 results in a large skew. Embodiments described herein use routing to an intermediate point to lower the skew while limiting the increase in wire length and the changes to the previous routing paths.

FIG. 3B shows the same source 310 and sinks 314, with an added intermediate point 332 connected to source 310 via routing path 311. As shown in FIG. 3B, routing path 311 is the only path directly connected to source 310, such that the source 310 is only connected to intermediate point 332. In other embodiments, any number of intermediate points may be used, with each intermediate point connected to the source 310. Intermediate point 332 is positioned to divide the set of sinks 314 roughly evenly in position, so that instead of an extremely long path length to sink 322 and a short path length to sink 321, the paths between these sinks 321, 322 is not divided and closer to balanced (though not exactly balanced for zero skew). As shown in FIG. 3B, the intermediate point 332 is placed between two subsets 330 and 331 of sinks. Subset 330 includes sinks 314A and routes 316A, and subset 331 includes sinks 314B and routes 316B. In various embodiments, different processes are used to determine intermediate point(s). This is described in further detail below with respect to FIGS. 4-6.

As shown in the embodiment of FIG. 3B, the updated routing tree 370 is structured such that the routing path directly attached to source 310 in FIG. 3A is gone, and the routing paths directly connected to intermediate point 332 are added, but the remaining routing paths remain the same. In other embodiments, the routing paths 330 and 331 may change. In some embodiments, splitting (e.g. to get paths 330 and 331) is performed, and then each subnet is routed individually from a subnet source (e.g. point 332 operates as a subnet source for routes 330 and 331). In other embodiments, other changes may be made to the routing paths, but embodiments that use as many routes as possible from initial routing tree 360 to limit the additional calculations for routing and maintain any benefits of the initial route (e.g. wire length limits for Steiner tree routing).

FIG. 3C then shows an additional updated routing tree 380 with an additional tier of intermediate points. In FIG. 3C, the routing path 311 from source 310 to intermediate point 332 remains the same, but new intermediate points 342A and 342B are added. This second tier of intermediate points 342A and 342B is connected to the first tier intermediate point 332 via routes 335A and 335B. Intermediate point 342A is positioned within subset 330, and intermediate point 342B is positioned within subset 331. In various embodiments, the placement criteria for different tiers of intermediate points may be different. For example, the first tier may be placed at an edge where two bounding boxes around subsets of sinks meet, while the second tier may be placed based on an average of x and y coordinate positions for sinks within the bounding box for a given subset of sinks. Routes connected to the second tier intermediate points 342A and 342B are adjusted as necessary just as before, and the remaining routes of subsets 330 and 331 remain the same. As mentioned above, in other embodiments, these routes may change as they are placed following the adjustments to the circuit design, with each path routed individually. This process may be repeated any number of times until the available number of sinks for an additional tier of intermediate points to connect to is less than a threshold number of sinks, the routing tree exceeds a wire length limit, or based on any other such criteria.

The clustering of sinks may be performed using various clustering algorithms to segment the sinks into subsets. Various combinations of single-linkage clustering, complete linkage clustering, average linkage clustering, k-means clustering, or other clustering algorithms may be used. Just as for other criteria, different clustering algorithms may be used at different tiers based on criteria such as the density and number of sinks at a given tier. Once the intermediate point(s) for a given tier are selected, routing paths from the intermediate point(s) to each cluster are generated, and any previous routes from the source or previous intermediate points are removed. The other routes in the tree remain unchanged, but mentioned above, these other routes may be adjusted at any point based on various changes in the circuit design.

Figure 4:
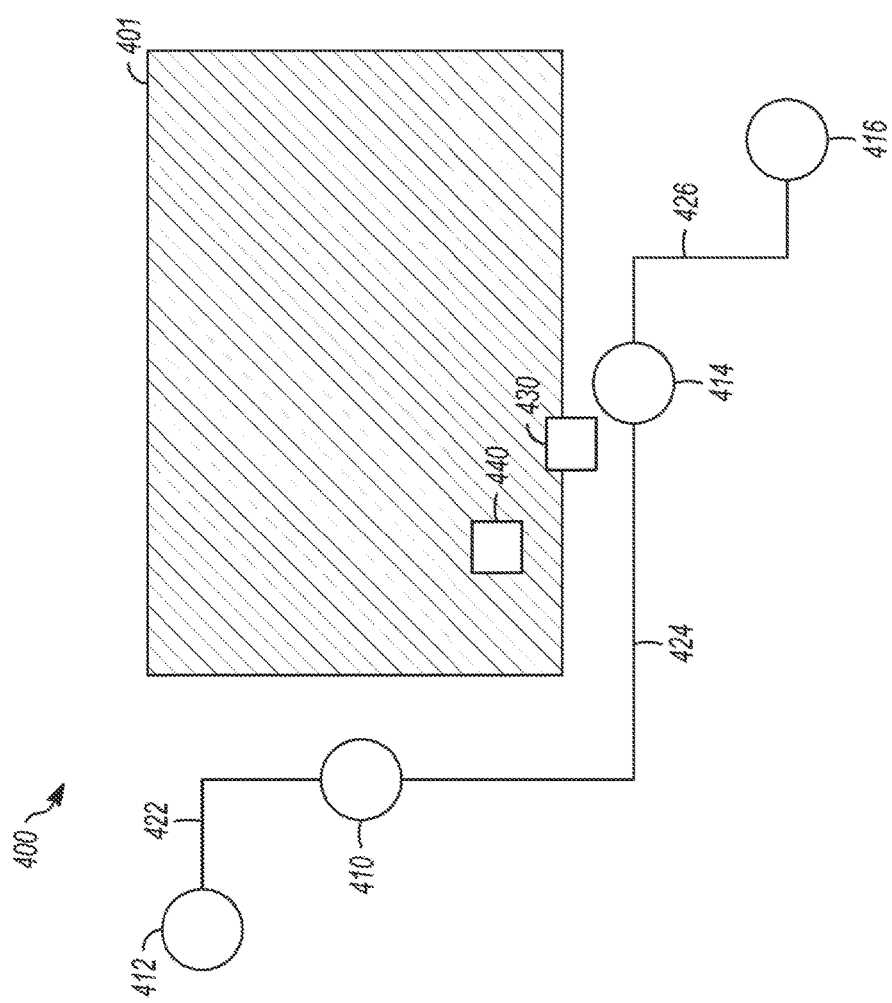
FIG. 4 illustrates aspects of routing tree generation in accordance with some embodiments described herein.
Figure 5:
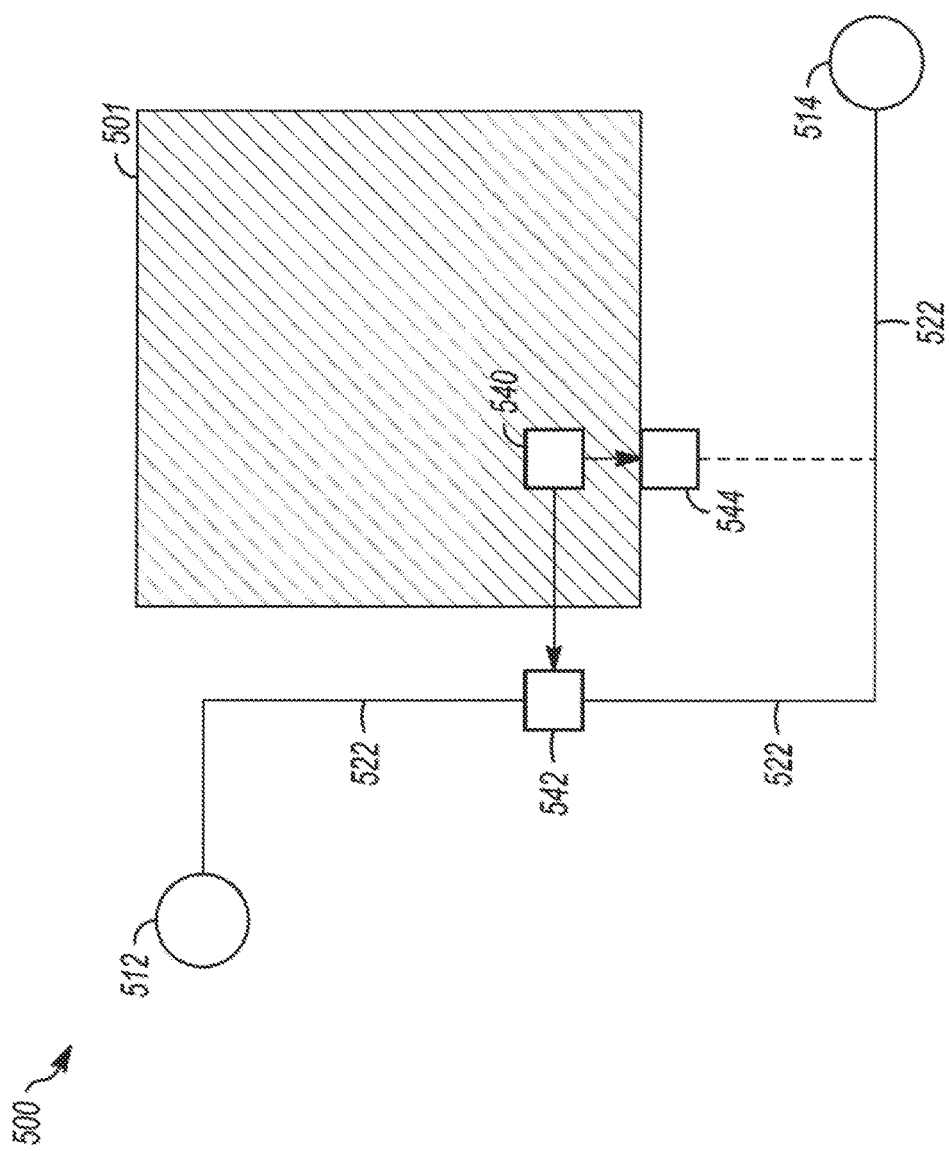
FIG. 5 illustrates aspects of routing tree generation in accordance with some embodiments described herein.

As described above, various different operations may be used for selection of intermediate points in different embodiments. FIGS. 4-6 illustrate aspects of routing tree generation in accordance with some embodiments described herein, and particularly describe various aspects of selection of intermediate points. In some designs, the intermediate point selected at a given tier may be blocked by other elements of the circuit design. Design 400 of FIG. 4 shows an example of this. Source 410 and sinks 412, 414, and 416 are connected by an initial routing tree including routes 422, 424, and 426. Position 440 is an average of the sink and source positions in design 400, and point 430 is an average of the sinks of design 400, either of which may be used for selection of an intermediate point in different embodiments. Design 400 also includes circuit element 401, which occupies a large space in the design 400, and blocks routing through the area covered by circuit element 401. This may be dealt with in a variety of ways, after the initial operations to calculate an initial intermediate point (e.g., via averages, bounding box edges, etc.).

FIG. 5 shows two possible options for adjusting the intermediate point based on the blockage. Design 500 of FIG. 5 includes sinks 512 and 514, with routes 522, and blocking circuit element 501. An initial intermediate point 540 has been identified, and is within a space not available for routing.

A first option is to identify an existing routing point closest to the initial intermediate point 540, and select this point as the intermediate point. In FIG. 5, point 542 is the point on the existing routes 522 closest to initial intermediate point 540. After point 542 is selected, any connections between the source or the previous tier intermediate points (depending on the current tier) and point 542 are removed, routes directly from the source or previous tier intermediate point(s) to point 542 are created, and any needed additional routes from point 542 to the associated subset(s) of sinks are created.

Alternatively, in some embodiments, the nearest open space at the edge of the blocking element (e.g., blocking circuit element 501) may be used. In the example of FIG. 5, point 544 is the nearest open point to initial intermediate point 540. Just as above, previous connections to the source or initial intermediate points are deleted after selection of point 544 in such embodiments, and replacement routes are created.

Figure 6C:
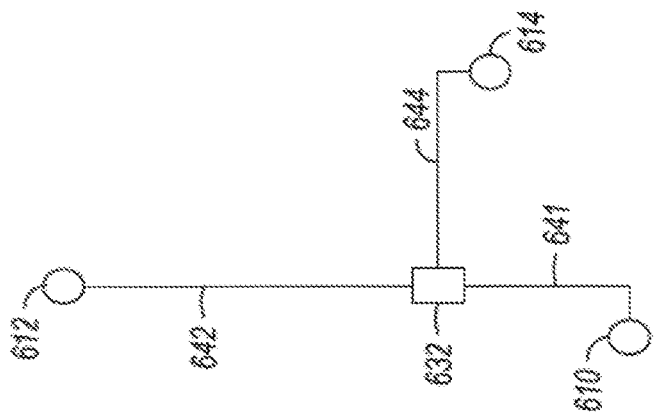
FIG. 6C illustrates aspects of routing tree generation in accordance with some embodiments described herein.
Figure 6B:
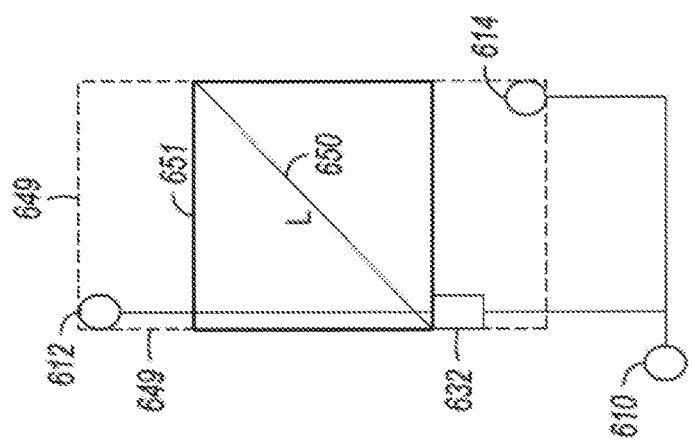
FIG. 6B illustrates aspects of routing tree generation in accordance with some embodiments described herein.
Figure 6A:
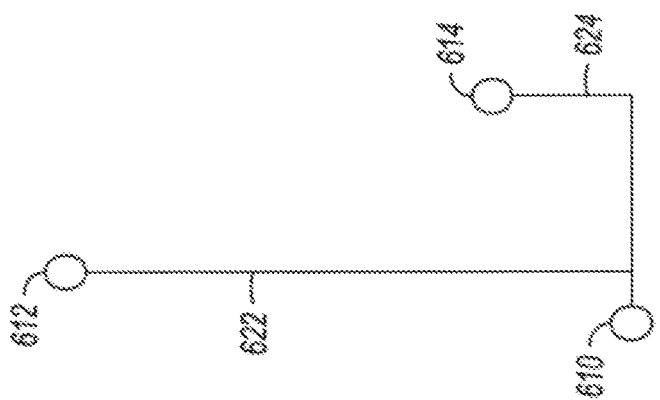
FIG. 6A illustrates aspects of routing tree generation in accordance with some embodiments described herein.

FIGS. 6 A-C illustrate a special case for generating a routing tree with two sinks in a subset or cluster. In FIG. 6A, source 610 (or an intermediate point from a previous tier) is connected to sinks 612 and 614 via routes 622 and 624. In order to identify intermediate point 632 in FIG. 6B, a bounding box 649 is created which is the smallest box including sinks 612 and 614 in the routing grid for the circuit design. Then, the largest square 651 possible within bounding box 649 is identified, with square 651 equidistant from the non-overlapping sides of bounding box 649. If bounding box 649 is already a square, this step is not necessary. The points at the corner or diagonal of square 651 are identified, and the point closest to source 610 is selected as the intermediate point. Another way of describing this operation is that an intermediate point is selected by identifying a line which is bounded by a bounding box for a first sink and a second sink of the plurality of sinks, passes through a geometric center of the bounding box; and has a slope value of one or negative one such that the first sink and the second sink are on opposite sides of the line. The intermediate point is selected as a point on the line closest to the source.

In FIGS. 6B and 6C, this is intermediate point 632. The process then proceeds as usual, with the routes 622, 624 directly connected to source 610 removed, route 641 between the source 610 and intermediate point 632 created, and the routes from intermediate point 632 to sinks 614 and 612 updated as needed, shown in FIG. 6C as routes 642 and 644.

Figure 7A:
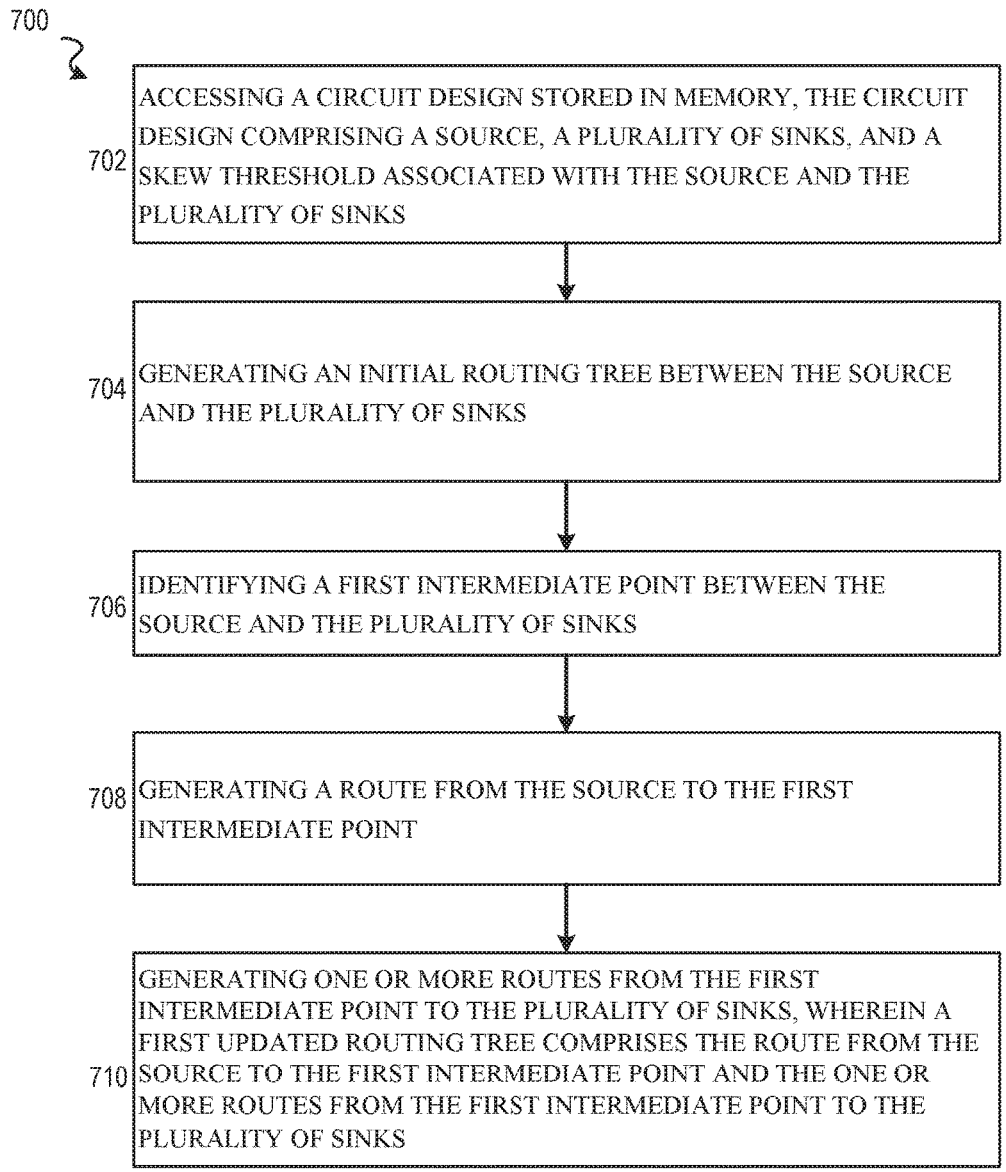
FIG. 7A describes a method for routing tree generation in accordance with some embodiments.

FIG. 7A describes a method 700 for routing tree generation in accordance with some embodiments. In some embodiments, method 700 is performed by a computing device with one or more processors. In some embodiments, method 700 is embodied in computer-readable instructions stored in a non-transitory storage device, such that when the instructions are executed by one or more processors of a device, the device performs method 700.

Method 700 begins with operation 702, where a device accesses a circuit design stored in memory, the circuit design comprising a source, a plurality of sinks, and a skew threshold associated with the source and the plurality of sinks. The circuit design may be stored in any acceptable circuit design file format, including various formats mentioned below. The initial routing tree between the source and the plurality of sinks is then generated in operation 704. In other embodiments, step 704 may be optional, with split sub-nets routed in operations similar to those of operation 710 described below. The initial routing tree may be a Steiner tree using a routing algorithm to connect all of the sinks with the source in a placement grid that also includes blocking circuit elements. In other embodiments, other initial routing trees may be used. In some embodiments, the circuit design may already include an initial routing tree when the corresponding method begins.

After the design with an initial routing tree is available, in operation 706, one or more intermediate points are identified. In one embodiment, a single first intermediate point is identified. In other embodiments, any number of intermediate points may be identified based on the layout of the source and sinks within a design, user inputs, or any other design criteria. Some embodiments may include a set of rules for applying different criteria in different circumstances, and at different tiers of a design of a routing tree.

Once the first intermediate point is identified, in operation 708, the wires in the routing tree are updated based on the position of the first intermediate point. This includes rerouting each subnet to generate paths from the source and the intermediate point and then on to each sink from the intermediate point, with each subnet routed separately.

Then in operation 710, the wire routes from the intermediate point to the sinks are generated. Any number of routes may be generated to the plurality of sinks. In some embodiments, as discussed above, the sinks are clustered into subgroups, and a route is created from the intermediate point to each subgroup. In some embodiments, a Steiner sub-tree for the intermediate point and the associated sinks is created, to minimize the wire length of the connections from the intermediate point to the sinks. In other embodiments, another basis for generation of routing paths may be used.

The result following operation 710 is an updated routing tree with the routes between the source and intermediate point, and paths between the intermediate point and the sinks.

Figure 7B:
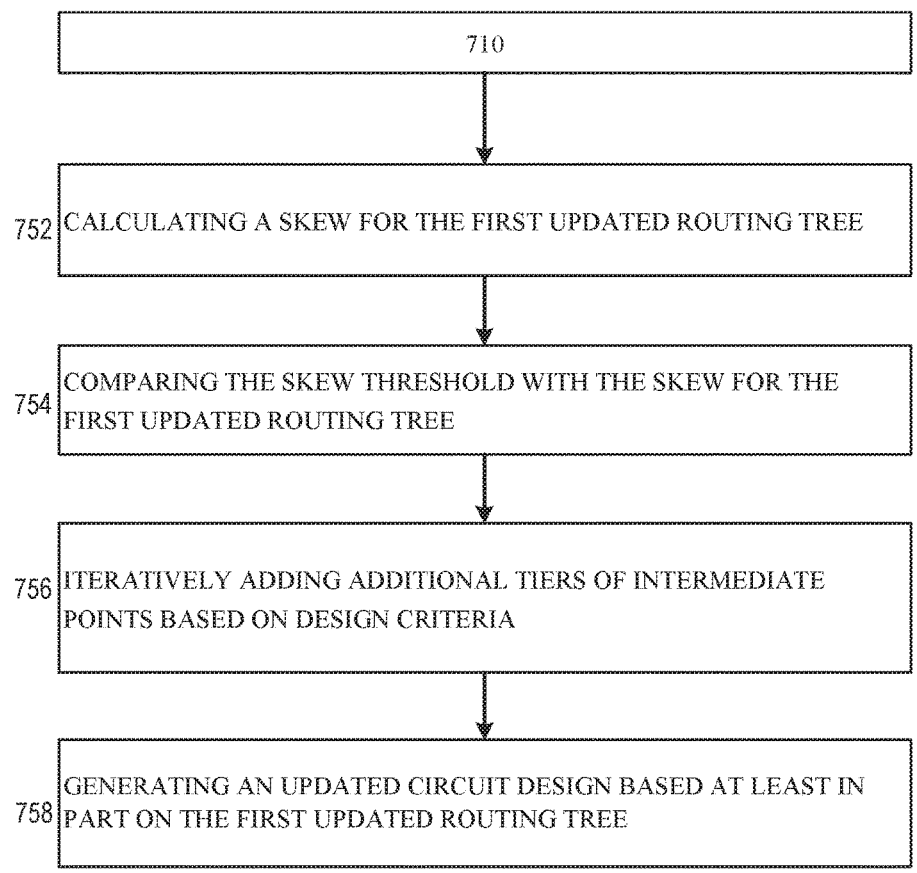
FIG. 7B describes aspects of an additional method for routing tree generation in accordance with some embodiments.

FIG. 7B then describes method 750, which may continue following the end of method 700 in some embodiments. Just as with method 700, method 750 may be implemented by a device, as instructions in a storage medium, or in any other acceptable implementation. Following generation of an updated routing tree in operation 710, method 750 continues with calculating a skew value for the updated routing tree in operation 752. The skew is compared with a skew threshold that is part of the circuit design constraints in operation 754.

In operation 756, the process for updating the routing tree continues iteratively based on the skew threshold. If the skew of the updated routing tree from operation 710 meets the skew threshold, the updated circuit design with the updated routing tree is generated in operation 758. If the skew of the updated routing tree does not meet the skew threshold, then additional tiers of intermediate points are added, and additional routes from the previous tier intermediate point(s) to the new tier intermediate point(s) are added as part of the iterative addition of intermediate points in operation 756.

This process continues until either the skew threshold is met or another limit is reached. This may be a limit on the number of tiers allowed, a threshold number of sinks not being available for a given number of intermediate points (e.g., the number of intermediate points becomes large relative to the number of sinks), or a maximum wire length is exceeded.

Figure 8:
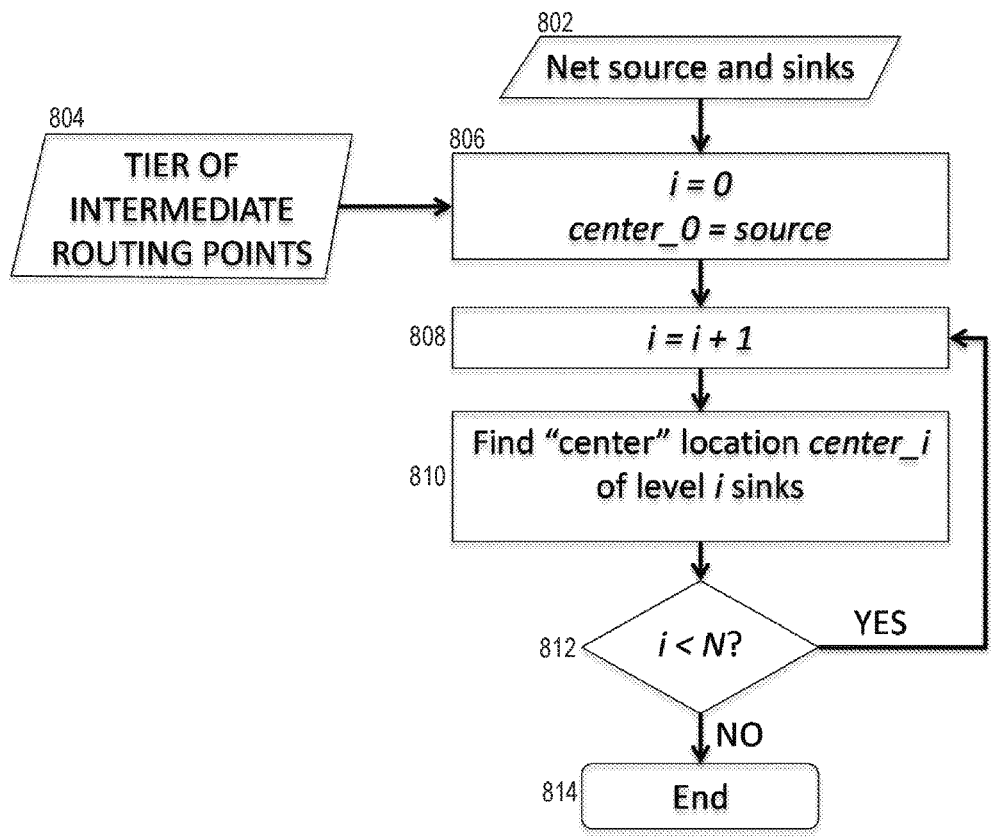
FIG. 8 describes aspects of a procedure for routing tree generation in accordance with some embodiments.

FIG. 8 describes aspects of a procedure for routing tree generation in accordance with some embodiments. The procedure of FIG. 8 describes aspects of the iterative operations for adding additional tiers of intermediate points to reduce skew in a routing tree in accordance with some embodiments. Block 802 provides the net information on the source and sinks in a design. Block 804 provides information or rules for each tier of intermediate routing points. This may include the number of intermediate routing points to be used at each tier, rules for clustering sinks that may be used to determine a number of intermediate points at each tier, additional criteria for selecting intermediate points at each tier (e.g., average position, median position, special rules for certain sink positions such as subgroups of sinks with only two sinks), or any other such required information. Block 806 establishes the "base" tier "i=0" with the source as the origination point. Block 808 increments to a next tier, and block 810 involves finding new "center" location(s) for sinks at the current level. These center locations are intermediate points for the one or more clusters of sinks in a tier below the base tier. As described above, this may include a single center location for an intermediate point, or any number of center locations based on various criteria. In block 812, design criteria for the routing tree are assessed. If additional updates are needed and allowed, the process returns to block 808. If no additional updates are needed (e.g., skew threshold met) or a criterion that bars further updates (e.g., acceptable number of tiers exceeded or acceptable total wire length of routing tree exceeded) is present, the process ends in block 814.

Figure 9:
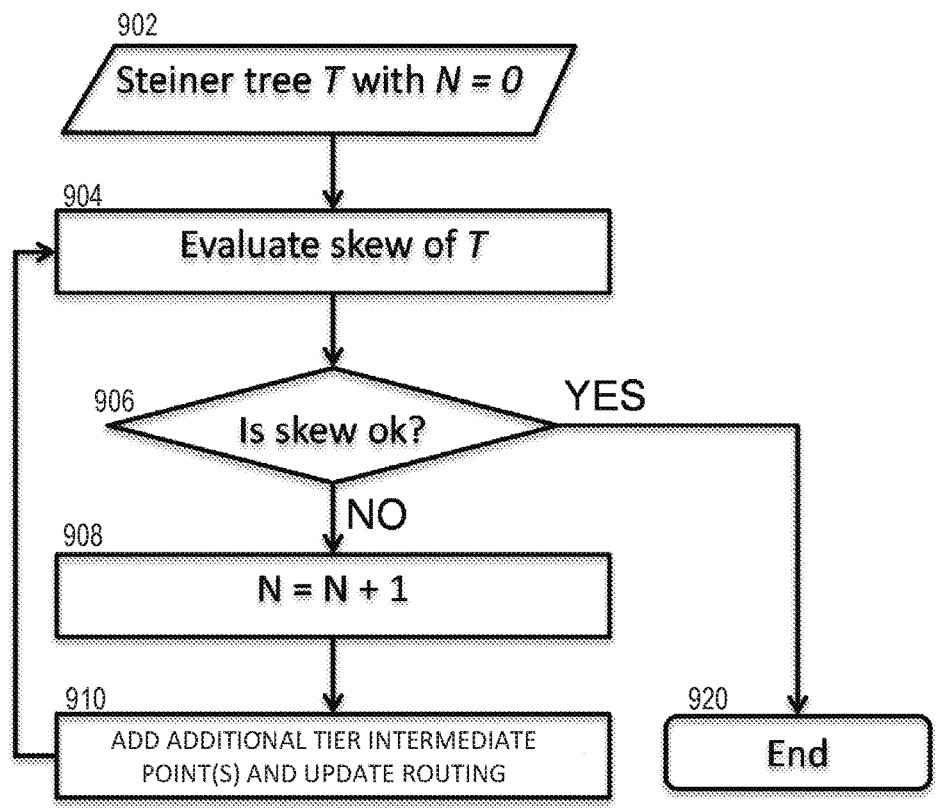
FIG. 9 describes aspects of a procedure for routing tree generation in accordance with some embodiments.

FIG. 9 describes aspects of a procedure for routing tree generation in accordance with some embodiments. FIG. 9 provides an additional description of an iterative process in accordance with embodiments described herein. Block 902 begins with a Steiner tree with no updates including intermediate points. The skew of the initial routing tree (e.g., Steiner tree) is compared with the design criteria in block 904. If the design criteria are met in block 906, the process ends at block 920. If the design criteria are not met, then the tier is incremented in block 908, and block 910 performs a procedure for updating the routing tree with intermediate points as described herein. The process then repeats until the design criteria are met (or additional iterations are blocked by other criteria).

While various operations and process steps are described above, additional embodiments are possible using different combinations of operations. The embodiments above may thus be modified with different combinations of operations, including intervening operations and repeated operations. In various additional embodiments, specific variations may function where an intermediate point is selected using a center of mass calculation for the plurality of sinks, or where an intermediate point is selected using a median position calculation for the plurality of sinks. In some embodiments, an intermediate point is selected by identifying a line which is bounded by a bounding box for a first sink and a second sink of the plurality of sinks; passes through a geometric center of the bounding box; and has a slope value of one or negative one such that the first sink and the second sink are on opposite sides of the line; and selecting the intermediate point as a point on the line closest to the source.

Further embodiments may operate by selecting an initial intermediate point, identifying a routing blockage associated with the initial intermediate point, and selecting the intermediate point by shifting the initial intermediate point to avoid the routing blockage. In such embodiments, shifting the initial intermediate point to avoid the routing blockage may involve several steps. These include generating an initial route between the plurality of sinks and selecting a closest point to the initial intermediate point on the initial route between the plurality of sinks as the intermediate point. Further embodiments involve shifting the initial intermediate point to avoid the routing blockage by identifying an empty location in a circuit layout of the circuit design closest to the initial intermediate point and selecting the empty location as the intermediate point. In other embodiments, additional operations for selecting an intermediate point may be used.

The various embodiments may also operate repeatedly by following an initial update based on a first intermediate point, identifying a second intermediate point between the first intermediate point and a first subset of plurality of sinks, and identifying a third intermediate point between the first intermediate point and a second subset of the plurality of sinks. This is for a tier with two intermediate points. Once the intermediate points are selected, the routing tree is updated by generating a route from the first intermediate point to the second intermediate point, generating a route from the first intermediate point to the third intermediate point, generating one or more routes from the second intermediate point to the first subset of the plurality of sinks, and generating one or more routes from the third intermediate point to the second subset of the plurality of sinks. In such an operation, a second updated routing tree comprises the route from the first intermediate point to the second intermediate point, the route from the first intermediate point to the third intermediate point, the one or more routes from the second intermediate point to the first subset of the plurality of sinks, and the one or more routes from the third intermediate point to the second subset of the plurality of sinks.

Such a process may be repeated again for a subsequent tier by generating a third tier of intermediate points comprising fourth and fifth intermediate points connected to the second intermediate point and sixth and seventh intermediate points connected to the third intermediate point, each point of the third tier of intermediate points further connected to a different subset of the plurality of sinks, generating a third updated routing tree based on the third tier of intermediate points.

This may continue for any acceptable number of tiers, total wire length, or until design criteria are met by repeatedly generating additional tiers of intermediate points with connections to intermediate points of a previous tier and subsets of the plurality of sinks until a skew for an updated routing tree for a final tier meets the skew threshold or a maximum wire length is exceeded, with a final updated circuit design being based on the final tier.

Figure 10:
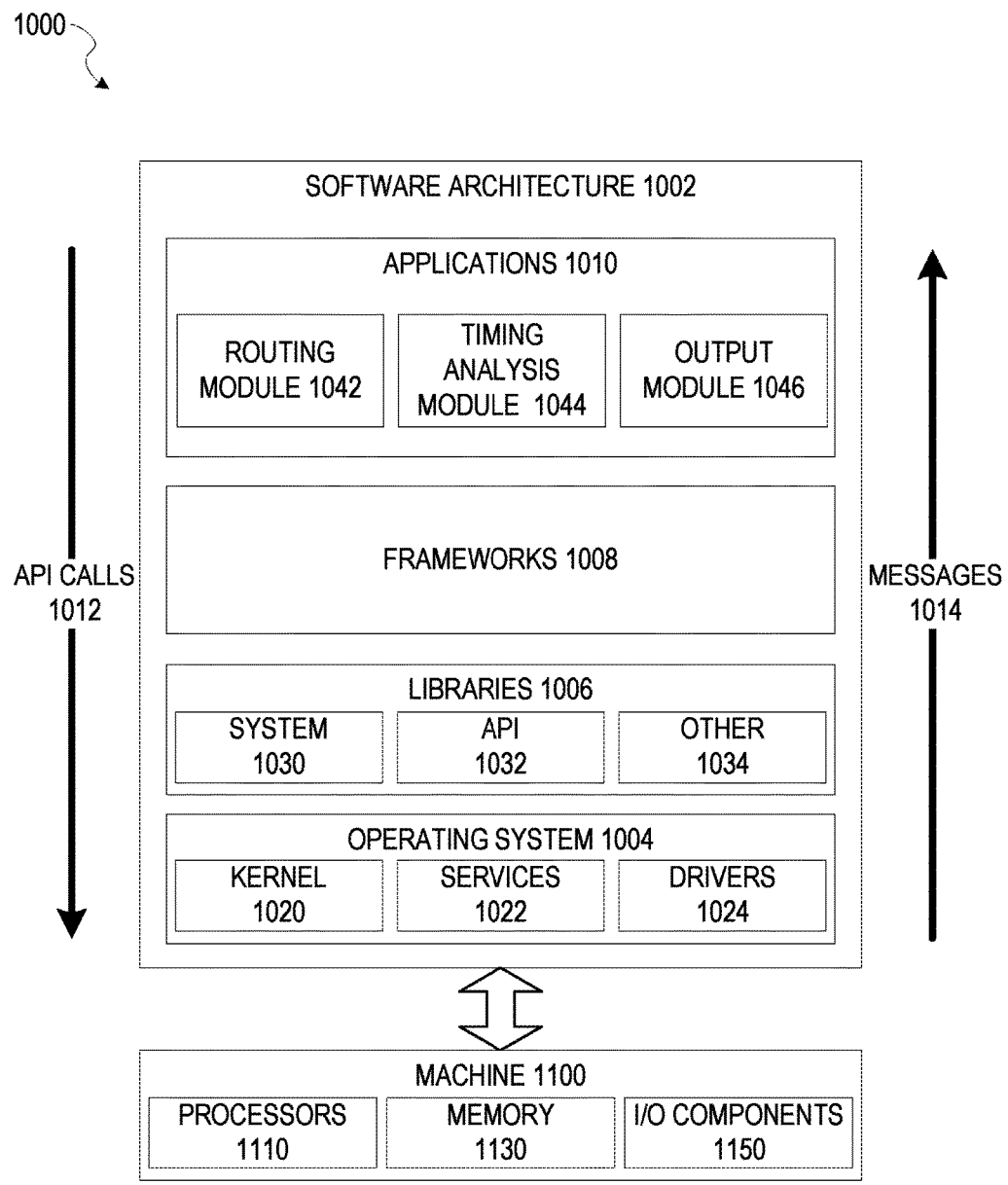
FIG. 10 is a block diagram illustrating an example of a software architecture that may be operating on an electronic design automation (EDA) computer and used with methods for routing tree generation to update a circuit design, according to some example embodiments.

FIG. 10 is a block diagram 1000 illustrating an example of a software architecture 1002 that may be operating on an electronic design automation (EDA) computer and used with methods for modifying a balanced clock structure, according to some example embodiments. Software architecture 1002 can be used as an electronic design automation computing device to implement any of the methods described above. Aspects of software architecture 1002 may, in various embodiments, be used to store circuit designs and execute timing analysis or optimization in an EDA environment to generate circuit designs, with physical devices generated using these circuit designs.

FIG. 10 is merely a non-limiting example of a software architecture 1002, and it will be appreciated that many other architectures can be implemented to facilitate the functionality described herein. In various embodiments, the software architecture 1002 is implemented by hardware such as machine 1100 that includes processors 1110, memory 1130, and I/O components 1150. In this example, the software architecture 1002 can be conceptualized as a stack of layers where each layer may provide a particular functionality. For example, the software architecture 1002 includes layers such as an operating system 1004, libraries 1006, frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, server computer of a server system, or any other device described herein may operate using elements of software architecture 1002. An EDA computing device described herein may additionally be implemented using aspects of the software architecture 1002, with the architecture 1002 adapted for operating to perform clock synthesis and modification of balanced clock structures in accordance with embodiments herein.

In one embodiment, an EDA application of applications 1010 performs routing tree generation and/or adjustments, according to embodiments described herein, using various modules within software architecture 1002. For example, in one embodiment, an EDA computing device similar to machine 1100 includes memory 1130 and one or more processors 1110. The processors 1110 implement a routing module 1042 to generate an updated routing tree from an initial routing tree based on criteria for an integrated circuit design. The processors 1110 also implement a timing analysis module 1044 to determine whether an updated routing tree meets timing criteria for the circuit design. The routing tree is finalized by an output module 1046 if the criteria/design thresholds are met, and updated by routing module 1042 if the criteria/design thresholds are not met.

In some embodiments, processor-implemented output module 1046 may then be used to update a display of I/O components 1150 of the EDA computing device with data associated with the updated routing tree generated by the process.

In various other embodiments, rather than being implemented as modules of one or more applications 1010, some or all of modules 1042, 1044, and 1046 may be implemented using elements of libraries 1006 or operating system 1004.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionality. The services 1022 can provide other common services for the other software layers. The drivers 1024 are responsible for controlling or interfacing with the underlying hardware, according to some embodiments. For instance, the drivers 1024 can include display drivers, signal processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1006 provide a low-level common infrastructure utilized by the applications 1010. The libraries 1006 can include system libraries 1030 such as libraries of multi-instance blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Moving Picture Experts Group-4 (MPEG4), Advanced Video Coding (H.264 or AVC), Moving Picture Experts Group Layer-3 (MP3), Advanced Audio Coding (AAC), Adaptive Multi-Rate (AMR) audio codec, Joint Photographic Experts Group (JPEG or JPG), or Portable Network Graphics (PNG)), graphics libraries (e.g., an OpenGL framework used to render in two dimensions (2D) and three dimensions (3D) in a graphic content on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement analysis described herein. This includes analysis of input design files for an integrated circuit design, along with any element of hierarchical analysis that may be used as part of or along with the embodiments described herein. While netlist files, library files, SDC files and viewdefinition files are examples that may operate within a software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) is configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1100 including processors 1110), with these operations being accessible via a network (e.g., the Internet) and via one or more appropriate interfaces (e.g., an application program interface (API)). In certain embodiments, for example, a client device may relay or operate in communication with cloud computing systems, and may store media content such as images or videos generated by devices described herein in a cloud environment.

The performance of certain of the operations may be distributed among the processors, not only residing within a single machine 1100, but deployed across a number of machines 1100. In some example embodiments, the processors 1110 or processor-implemented modules are located in a single geographic location (e.g., within a home environment, an office environment, or a server farm). In other example embodiments, the processors 1110 or processor-implemented modules are distributed across a number of geographic locations.

Figure 11:
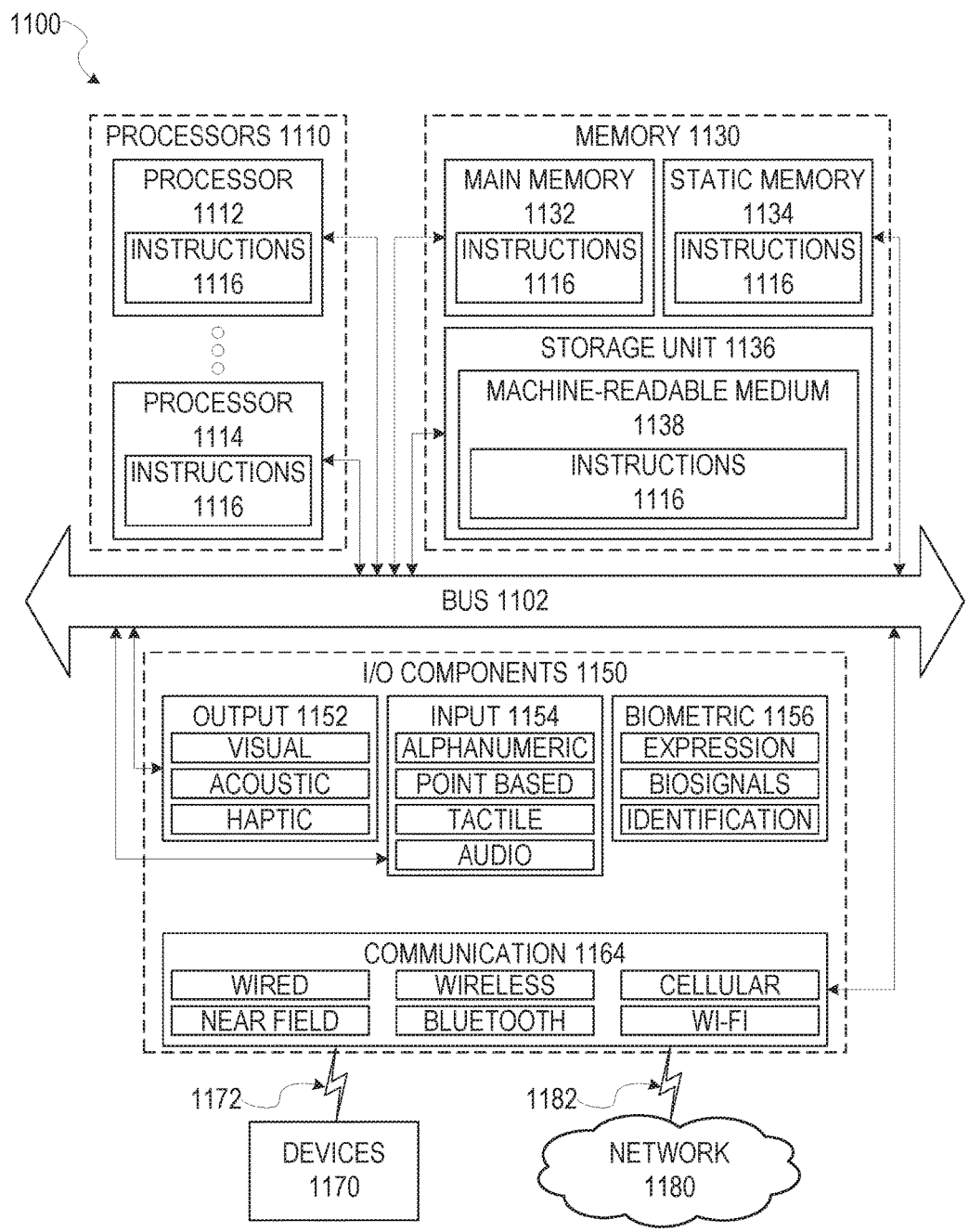
FIG. 11 is a diagrammatic representation of a machine in the form of a computer system within which a set of instructions are executed, causing the machine to perform any one or more of the methodologies discussed herein, according to some example embodiments.

FIG. 11 is a diagrammatic representation of the machine 1100 in the form of a computer system within which a set of instructions may be executed for causing the machine 1100 to perform any one or more of the methodologies discussed herein, according to an example embodiment. FIG. 11 shows components of the machine 1100, which is, according to some embodiments, able to read instructions from a machine-readable medium (e.g., a machine-readable storage medium) and perform any one or more of the methodologies discussed herein. In some embodiments, the machine 1100 may operate with instructions 1116 (e.g., software, a program, an application, an applet, an app, or other executable code) for causing the machine 1100 to perform any one or more of the methodologies discussed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, a set-top box (STB), a personal digital assistant (PDA), a media system, a cellular telephone, a smart phone, a mobile device, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102. In an example embodiment, the processors 1110 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiples cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in an example embodiment, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., instructions 1116) for execution by a machine (e.g., machine 1100), such that the instructions 1116, when executed by one or more processors of the machine 1100 (e.g., processors 1110), cause the machine 1100 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various example embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow 100, or outputs for circuit fabrication. In various embodiments, outputs of a timing analysis are used to generate updates and changes to a circuit design, and after a final closure of timing with all associated timing thresholds and design requirements met, circuit design output files are used to generate masks and other physical outputs for generation of a circuit. As described herein, "requirements", "design elements", and other aspects of a circuit design refer to selectable values that are set as part of the design of a circuit. Such design requirements or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a Universal Serial Bus (USB)).

Transmission Medium

In various example embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling. In this example, the coupling 1182 can implement any of a variety of types of data transfer technology, such as Single Carrier Radio Transmission Technology (1xRTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-speed Packet Access (HSPA), Worldwide Interoperability for Microwave Access (WiMAX), Long Term Evolution (LTE) standard, others defined by various standard-setting organizations, other long range protocols, or other data transfer technology.

Furthermore, the machine-readable medium 1138 is non-transitory (in other words, not having any transitory signals) in that it does not embody a propagating signal. However, labeling the machine-readable medium 1138 "non-transitory" should not be construed to mean that the medium 1138 is incapable of movement; the medium 1138 should be considered as being transportable from one physical location to another. Additionally, since the machine-readable medium 1138 is tangible, the medium 1138 may be considered to be a machine-readable device.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, techniques, instruction sequences, and computing machine program products that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A computerized method for a routing tree construction, the computerized method comprising:
    accessing, using one or more hardware processors, a circuit design stored in a memory, the circuit design comprising a source, a plurality of sinks, and a skew threshold associated with the source and the plurality of sinks;
    generating, using the one or more hardware processors, an initial routing tree between the source and the plurality of sinks;
    identifying, using the one or more hardware processors, a first intermediate point between the source and the plurality of sinks;
    generating, using the one or more hardware processors, a route from the source to the first intermediate point;
    generating, using the one or more hardware processors, one or more routes from the first intermediate point to the plurality of sinks, wherein a first updated routing tree comprises the route from the source to the first intermediate point and the one or more routes from the first intermediate point to the plurality of sinks;
    calculating, using the one or more hardware processors, a skew for the first updated routing tree;
    comparing, using the one or more hardware processors, the skew threshold with the skew for the first updated routing tree; and
    generating, using the one or more hardware processors, an updated circuit design based at least in part on the first updated routing tree.

2. The computerized method of claim 1, wherein the first intermediate point is selected using a center of mass calculation for the plurality of sinks.

3. The computerized method of claim 1, wherein the first intermediate point is selected using a median position calculation for the plurality of sinks.

4. The computerized method of claim 1, wherein the first intermediate point is selected by identifying a line which:
    is bounded by a bounding box for a first sink and a second sink of the plurality of sinks;
    passes through a geometric center of the bounding box; and
    has a slope value of one or negative one such that the first sink and the second sink are on opposite sides of the line; and
    selects the first intermediate point as a point on the line closest to the source.

5. The computerized method of claim 1, wherein the first intermediate point is further selected by:
    selecting an initial intermediate point;
    identifying a routing blockage associated with the initial intermediate point; and
    selecting the first intermediate point by shifting the initial intermediate point to avoid the routing blockage.

6. The computerized method of claim 5, wherein the shifting the initial intermediate point to avoid the routing blockage comprises:
    generating an initial route between the plurality of sinks; and
    selecting a closest point to the initial intermediate point on the initial route between the plurality of sinks and the first intermediate point.

7. The computerized method of claim 5, wherein the shifting the initial intermediate point to avoid the routing blockage comprises:
    identifying an empty location in a circuit layout of the circuit design closest to the initial intermediate point; and
    selecting the empty location as the first intermediate point.

8. The computerized method of claim 1, further comprising:
    identifying a second intermediate point between the first intermediate point and a first subset of sinks of the plurality of sinks;
    identifying a third intermediate point between the first intermediate point and a second subset of sinks of the plurality of sinks;
    generating a route from the first intermediate point to the second intermediate point;
    generating a route from the first intermediate point to the third intermediate point;
    generating one or more routes from the second intermediate point to the first subset of sinks; and
    generating one or more routes from the third intermediate point to the second subset of sinks, wherein a second updated routing tree comprises the route from the first intermediate point to the second intermediate point, the route from the first intermediate point to the third intermediate point, the one or more routes from the second intermediate point to the first subset of sinks, and the one or more routes from the third intermediate point to the second subset of sinks;
wherein the generating an updated circuit design is further based at least in part on the second updated routing tree.

9. The computerized method of claim 8, wherein the second updated routing tree is generated in response to the skew for the first updated routing tree not meeting the skew threshold.

10. The computerized method of claim 8, further comprising generating a third tier of intermediate points comprising a fourth intermediate point and a fifth intermediate point connected to the second intermediate point, and a sixth intermediate point and a seventh intermediate point connected to the third intermediate point, each point of the third tier of intermediate points further connected to a different subset of sinks of the plurality of sinks; and
generating a third updated routing tree based on the third tier of intermediate points.

11. The computerized method of claim 10, wherein the second updated routing tree is generated in response to a skew for the second updated routing tree not meeting the skew threshold.

12. The computerized method of claim 1, further comprising:
repeatedly generating additional tiers of intermediate points with connections to intermediate points of a previous tier and subsets of sinks of the plurality of sinks until a skew for an updated routing tree for a final tier meets the skew threshold or a maximum wire length is exceeded;
wherein the updated circuit design is based on the final tier.

13. The computerized method of claim 12, wherein a number of intermediate points in each tier of the additional tiers of intermediate points is selected by an operator input.

14. The computerized method of claim 13, further comprising generating a set of masks from the updated circuit design for use in generating an integrated circuit comprising the updated circuit design.

15. A device for generating a circuit design, the device comprising:
a memory configured to store a circuit design, the circuit design comprising a source, a plurality of sinks, and a skew threshold associated with the source and the plurality of sinks; and
one or more processors coupled to the memory and configured to perform operations for generating an updated circuit design, the operations comprising:
accessing the circuit design stored in the memory;
identifying a first intermediate point between the source and the plurality of sinks;
generating a route from the source to the first intermediate point; and
generating one or more routes from the first intermediate point to the plurality of sinks, wherein a first updated routing tree comprises the route from the source to the first intermediate point and the one or more routes from the first intermediate point to the plurality of sinks.

16. The device of claim 15, wherein the one or more processors are further configured to perform additional operations comprising:
calculating a skew for the first updated routing tree;
comparing the skew threshold with the skew for the first updated routing tree; and
in response to determining that the skew meets the skew threshold, generating an updated circuit design based at least in part on the first updated routing tree.

17. The device of claim 15, wherein the one or more processors are further configured to perform additional operations comprising:
calculating a skew for the first updated routing tree;
comparing the skew threshold with the skew for the first updated routing tree;
in response to determining that the skew does not meet the skew threshold, repeatedly generating additional tiers of intermediate points with connections to intermediate points of a previous tier and subsets of sinks of the plurality of sinks until a skew for an updated routing tree for a final tier of intermediate points meets the skew threshold or a maximum wire length is exceeded; and
generating an updated circuit design based at least in part on the updated routing tree for the final tier of intermediate points.

18. A non-transitory computer-readable storage medium comprising instructions that, when executed by one or more processors of a computing device, cause the computer device to perform operations for an electronic design automation, the operations comprising:
accessing a circuit design stored a memory coupled to the one or more processors, the circuit design comprising a source, a plurality of sinks, and a skew threshold associated with the source and the plurality of sinks;
analyzing an initial routing tree between the source and the plurality of sinks to determine that the initial routing tree does not meet the skew threshold; and
in response to determining that the initial routing tree does not meet the skew threshold:
identifying a first intermediate point between the source and the plurality of sinks;
generating a route from the source to the first intermediate point;
generating one or more routes from the first intermediate point to the plurality of sinks, wherein a first updated routing tree comprises the route from the source to the first intermediate point and the one or more routes from the first intermediate point to the plurality of sinks;
calculating a skew for the first updated routing tree; and
comparing the skew threshold with the skew for the first updated routing tree.

19. The non-transitory computer readable medium of claim 18, wherein the instructions further cause the one or more processors to perform operations comprising:
in response to determining that the skew does not meet the skew threshold, repeatedly generating additional tiers of intermediate points with connections to intermediate points of a previous tier and subsets of sinks of the plurality of sinks until a skew for an updated routing tree for a final tier of intermediate points meets the skew threshold or a maximum wire length is exceeded.

20. The non-transitory computer readable medium of claim 19 wherein, each intermediate point of each additional tier of the additional tiers of intermediate points is generated using a median position calculation from a prior intermediate point to an associated subsets of sinks of the plurality of sinks.

* * * * *